(12) United States Patent
Nagashima et al.

(10) Patent No.: US 6,678,204 B2
(45) Date of Patent: Jan. 13, 2004

(54) SEMICONDUCTOR MEMORY DEVICE WITH HIGH-SPEED OPERATION AND METHODS OF USING AND DESIGNING THEREOF

(75) Inventors: Osamu Nagashima, Kanagawa (JP); Joseph Dominic Macri, San Francisco, CA (US)

(73) Assignees: Elpida Memory Inc., Tokyo (JP); ATI Technologies, Inc., Thornhill (CA)

( * ) Notice: Subject to any disclaimer, the term of this patent is extended or adjusted under 35 U.S.C. 154(b) by 33 days.

(21) Appl. No.: 10/026,755

(22) Filed: Dec. 27, 2001

(65) Prior Publication Data

US 2003/0123318 A1 Jul. 3, 2003

(51) Int. Cl.[7] .............................. G11C 8/12; G11C 8/18
(52) U.S. Cl. ............. 365/233; 365/230.03; 365/230.04; 711/5
(58) Field of Search .......................... 365/233, 230.03, 365/230.04, 230.08; 711/5

(56) References Cited

U.S. PATENT DOCUMENTS 5,818,785 A * 10/1998 Ohshima ............... 365/230.03
5,881,016 A * 3/1999 Kenkare et al. ....... 365/230.03
6,134,163 A * 10/2000 Takahashi ................ 365/205
6,453,401 B1 * 9/2002 Barth et al. ................ 711/167

* cited by examiner

Primary Examiner—Richard Elms
Assistant Examiner—Jung H. Hur
(74) Attorney, Agent, or Firm—Foley & Lardner

(57) ABSTRACT

Two types of command interval specifications are defined as first and second command interval specifications. The first command interval specifications is defined as the relationship between a preceding command and a following command that are issued for the same bank, while the second command interval specifications is defined as the relationship between a preceding command and a following command that are issued for different banks, respectively. As for the second command interval specification, since target banks are different between a preceding command and a following command, the following command is executed during the column circuits precharge after the preceding command. Therefore, in the case of the second command interval specification, a command interval is substantially shortened. In addition, pairs of banks are defined as bank pairs, and are applied the first and second command interval specifications, so that the DRAM device is small-sized.

29 Claims, 13 Drawing Sheets

| COMMAND A | WRITE | BANK 0 |
| COMMAND B | READ | BANK 1 |

FIG.5

| COMMAND A | WRITE | BANK 0 |
| COMMAND B | READ | BANK 2 |

FIG.6

SEMICONDUCTOR MEMORY DEVICE WITH HIGH-SPEED OPERATION AND METHODS OF USING AND DESIGNING THEREOF

BACKGROUND OF THE INVENTION

The present invention relates to a semiconductor memory device, and in particular, to methods of using and designing a dynamic random access memory (DRAM) device.

As well known, DRAM devices are one of the dominant memory devices and, due to their high density and relatively low manufacturing cost, are presently used for the majority of memory applications. For example, DRAM devices are used as main memories in computer systems, graphic memories on graphic cards, buffer memories on network cards, or the like.

With more recent microprocessors operating at 1 GHz and above, DRAM devices are also required to operate at a faster rate. To obtain the high-rate operation, especially to shorten command intervals in DRAM device, one of relevant approaches known to the inventors divides common I/O lines into more common I/O lines, according to the division of the memory cell arrays. The relevant approach decreases the "R" component of time constant "CR" in relation to each of common I/O lines, so as to obtain the high-rate operation.

The above relevant approach, however, causes chip-size of DRAM device to be large. According to the relevant approach, the length of each of the common I/O lines becomes short to make the "R" component small, while the number of the common I/O lines increases. Because the common I/O lines are coupled to the respective column-related circuits, such as write amplifiers, read amplifiers and precharge circuits, the relevant approach requires more column-related circuits, as the number of the common I/O lines increases. Thus the number of column-related circuits also increase requiring larger physical space.

In addition, the above relevant approach does not consider characteristics of "memory applications." Data read/write operations are not the same in memory applications, and data sequences are handled in various manners. In spite, the above relevant approach is not an application-specified approach, but an approach common to all memory applications. Therefore, the relevant approach might not be feasible for some memory applications.

Thus, it is desirable to provide faster DRAM devices, in particular, ones that are small in chip-size.

SUMMARY OF THE INVENTION

The present invention provides a DRAM device which is feasible for at least some memory applications and which can achieve high-rate operation.

In some of memory applications, such as a graphic memory on a graphic card or a buffer memory on a network card, data are sequentially written into a memory device and are also sequentially read out of the memory device. In this case, memory controller for the memory device can consciously select, for each predetermined data length, different one of memory banks included in the memory device, and thereby, can easily predict the memory bank sought to be written data into or sought to be read data out.

The inventors of the present invention direct their attention to the characteristics of the data read/write operations in some memory applications, then define two types of command interval specifications. According to one aspect of the present invention, one of the command interval specifications is defined as the relationship between a preceding command and a following command that are issued for the same bank, while the other of the command interval specifications is defined as the relationship between a preceding command and a following command that are issued for different banks, respectively. The former is referred to as a first command interval specification, while the latter is referred to as a second command interval specification. The first and second command interval specifications are different from each other. As for the second command interval specification, since target banks are different between a preceding command and a following command, the following command can be executed during the column circuits precharge (e.g. a precharge of a common I/O line) after the preceding command. Therefore, a time interval defined in the second command interval specification can be shorter than another time interval defined in the first command interval specification, in accordance with some commands, such as commands accompanied with the column circuits precharge.

One aspect of the present invention further defines pairs of banks as bank pairs, and furthermore, applies the first and second command interval specifications to the bank pairs. That is, in the bank pair case, the first command interval specifications is defined as the relationship between a preceding command and a following command that are issued for the same bank pair, while the second command interval specifications is defined as the relationship between a preceding command and a following command that are issued for different bank pairs, respectively.

In addition, because the memory controller can easily control the data allocation in accordance with some applications, the memory controller can easily lower the probability that the first command interval specification. This allows the banks belonging to the same bank pair to share the respective column-related circuits, and makes the memory speed high, because the probability that the second command interval specification is used is higher. Thus one aspect of the present invention provides a DRAM that is small in chip-size because of the sharing the column-related circuits and that is faster for some memory applications.

It is to be understood that both the foregoing description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the present invention, and together with the description, serve to explain the principles of the present invention. In the drawings.

FIG. 5 is an example of a command sequence where two commands are issued for the banks belonging to the same bank-pair;

FIG. 6 is an example of a command sequence where two commands are issued for the banks belonging to different bank-pairs, respectively;

DETAILED DESCRIPTION OF THE PREFERRED EMBODIMENTS

Conceptual Embodiment

Figure 1:
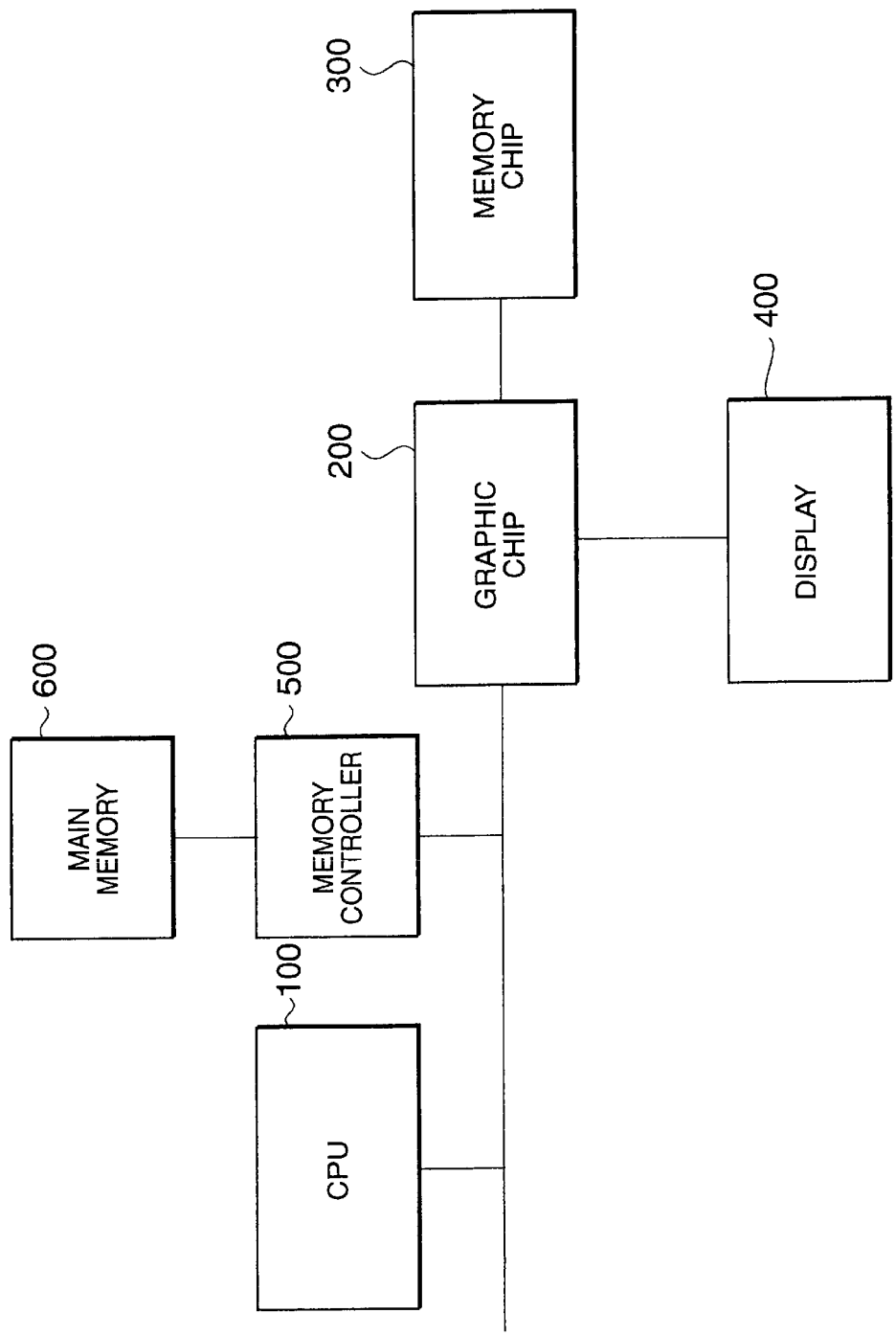
FIG. 1 is a schematic block diagram of a system configuration in accordance with a preferred embodiment of the present invention.

Description will be at first made about a conceptual embodiment of the present invention prior to a concrete embodiment of the present invention.

In the recent DRAM scheme, a DRAM device comprises a plurality of banks. Each bank has the same configuration, being composed of a number of storage cells or memory cells organized into lows and columns. The DRAM device having banks permits interleaving data between banks to reduce access times and increase the speed of the memory.

In general, a command interval specification is defined for a DRAM device, and a memory controller carries out bank-accessing and read/write operations for the DRAM device in compliance with the command interval specification.

According to this conceptual embodiment, two types of command interval specifications are defined: first and second command interval specifications. The first and second command interval specifications are held in a memory controller, and the memory operation for a DRAM device is carried out in accordance with the first and second command interval specifications under the control of the memory controller. The first command interval specification relates to the relationship between a preceding command and a following command that are issued for the same bank, while the second command interval specification relates to the relationship between a preceding command and a following command that are issued for different banks, respectively. The first and second command interval specifications are different from each other. For example, a time interval defined in the second command interval specification can be shorter than another time interval defined in the first command interval specification, for some combinations of the preceding commands accompanied with a column circuits precharge (e.g. a precharge of common I/O lines) and the following commands.

Specifically, first and second command interval specifications according to this conceptual embodiment are defined as following

TABLE 1

First Command Interval Specification
(For the same bank (or the same bank pair))

| | | Following Command | | | | | |
|---|---|---|---|---|---|---|---|
| | | READ | WRIT | ACTV | PRE | PALL | PEF |
| Preceding Command | READ | tCCD | 7tCK+1 | illegal | tRDP | tRDP | illegal |
| | WRIT | tWRD+1 | tCCD | illegal | tWDP | tWDP | illegal |
| | ACTV | tRCD | tRCD | illegal | tRAC | tRAC | illegal |
| | PRE | illegal | illegal | tRP | illegal | illegal | tRP |
| | PALL | illegal | illegal | tRP | illegal | illegal | tRP |
| | PEF | illegal | illegal | tRFC | illegal | illegal | tRFC |

TABLE 2

Second Command Interval Specification
(For the different banks (or the different bank pairs))

| | | Following Command | | | | | |
|---|---|---|---|---|---|---|---|
| | | READ | WRIT | ACTV | PRE | PALL | PEF |
| Preceding Command | READ | tCCD | 7tCK | tCK | tCK | tRDP | illegal |
| | WRIT | tWRD | tCCD | tCK | tCK | tWDP | illegal |
| | ACTV | tCK | tCK | tRRD | tCK | tRAC | illegal |
| | PRE | tCK | tCK | tCK | tCK | tCK | tRP |
| | PALL | illegal | illegal | tRP | illegal | illegal | tRP |
| | PEF | illegal | illegal | tRFC | illegal | illegal | tRFC |

Herein, tCK is "clock", tCCD is "column-command to column-command delay time", and tWRD is "write command to read command delay time." The other symbols is used in the same way of conventional arts.

Referring to Tables. 1 and 2, the first and second command specifications are different from each other in an interval that is from a write command of a preceding command to a read command of a following command, and in another interval that is from a read command of a preceding command to a write command of a following command. The referred intervals included in the first command interval specification are longer by "1" than the referred intervals included in the second command interval specification, "1" being "column circuits precharge" time. The interval from read command to write command may be the same interval between the first and second command interval specifications, depending upon memory environments such as the way of using memory device and the architecture of the memory device.

In the second command interval specification, target banks are different between a preceding command and a following command. Therefore, in the case where the operations are compliant with the second command interval specification, the following command can be executed during the column circuits precharge (e.g. the precharge of common I/O lines) after the preceding command, so that the intervals in the second command interval specification is shortened. As a result, DRAM device operates on higher rate if the event, to which the second command interval specification is applied, occurs.

In addition, according to another conceptual embodiment, pairs of banks are defined as bank pairs, and the foregoing first and second command interval specifications are applied to the bank pairs. That is, in this conceptual embodiment, the first command interval specifications is defined as the relationship between a preceding command and a following command that are issued for the same bank pair, while the second command interval specifications is defined as the relationship between a preceding command and a following command that are issued for different bank pairs, respectively. In this case, the command intervals are substantially shortened if the events compliant with the second command interval specification occur in the DRAM device.

In this embodiment, since the memory controller can easily control the data allocation for some memory applications, such as a graphic memory or a buffer memory used for network card, the probability that the first command interval specification is used can also be easily controlled to be lower. This allows the banks belonging to the same bank pair to share the respective column-related circuits, such as a read amplifier, a write amplifier, and a precharge circuit. Thus the DRAM device according to this embodiment can be small-sized.

Concrete Embodiment

Now, a description will be made about the concrete embodiment of the present invention, that is based on the above-mentioned conceptual embodiment.

Structure

Referring to FIG. 1, a system according to this embodiment comprises a CPU 100, a graphic chip 200, a memory chip 300, a display device 400, a memory controller 500 and a main memory 600. In this concrete embodiment, the memory controller 500 and the main memory 600 operate in similar way of the conventional art. An explanation about them is therefore omitted in this embodiment, but the present invention is not limited to the concrete embodiment.

The CPU 100 sends primitive instructions to the graphic chip 200. The graphic chip 200 interprets the primitive instructions and issues, for the memory chip 300, commands and data bits corresponding to the primitive instructions. In addition, the graphic chip 200 controls the display device 400 via a DAC (not shown) so that the display device 400 displays thereon the data read out of the memory chip 300. For example, when the CPU 100 sends to the graphic chip 200 a line-drawing instruction which includes designation of a starting point and an end point, the graphic chip 200 calculates the straight line connecting between the starting point and the end point and issues for the memory chip 300 a write command to write data bits of the straight line into the memory chip 300. On the other hand, the graphic chip 200 issues for the memory chip 300 a read command to read out of the memory chip 300 the data bits of the straight line, while controlling the display device 400 to display the straight line on the display device 400.

As apparent from the above-description with FIG. 1, in this embodiment, memory application is implemented as a frame buffer or a video memory in the memory chip 300. For the memory application, the memory chip 300 serves as a semiconductor memory device, while the graphic chip 200 serves as a memory controller for the memory chip 300. That is, the graphic chip 200 issues commands for the memory chip 300 in compliance with the above-mentioned first and second command interval specifications, while the memory chip 300 is controlled under the control according to their specifications.

Figure 2:
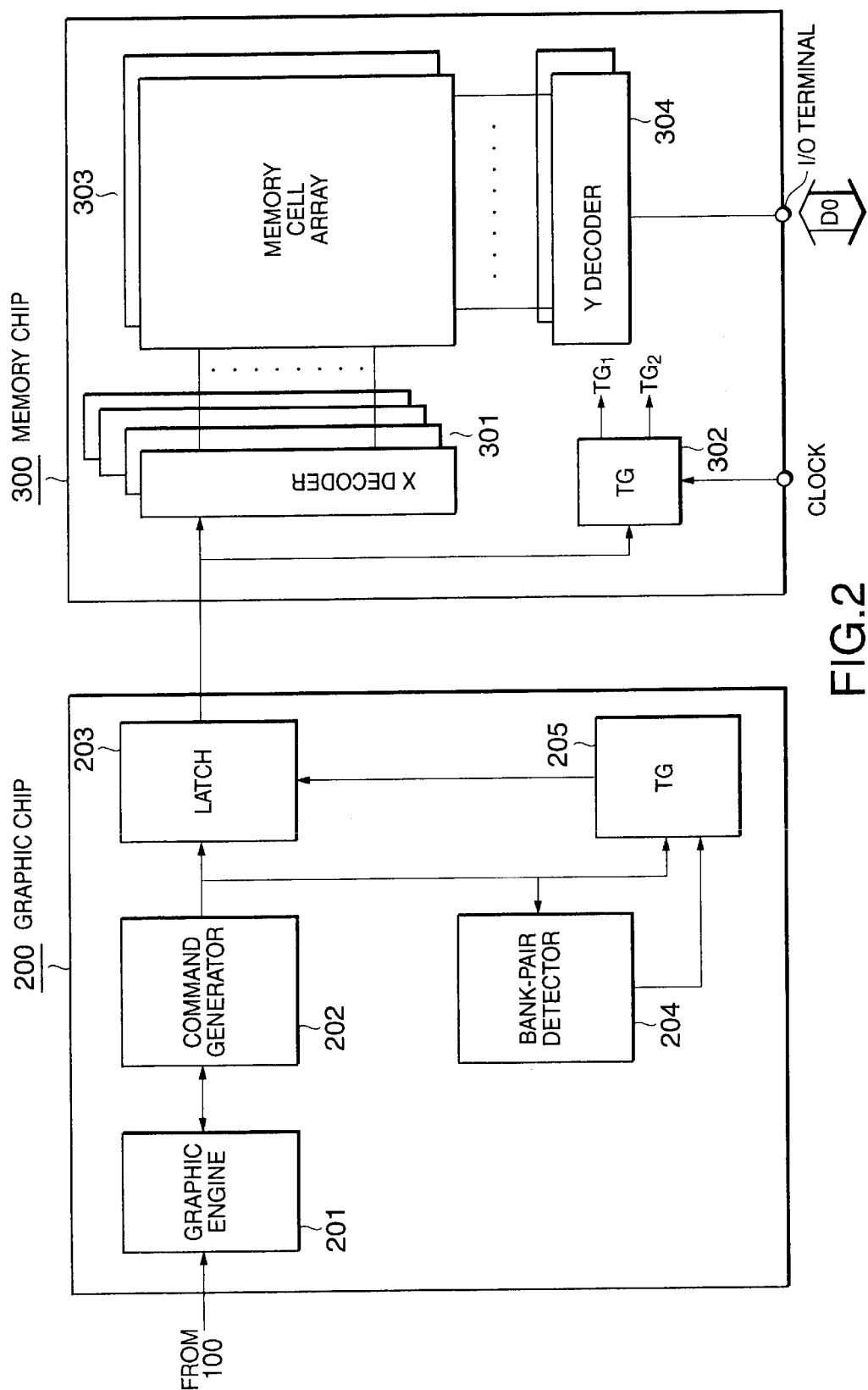
FIG. 2 is a schematic block diagram of the graphic chip and the memory chip illustrated in FIG. 1.

With reference to FIG. 2, the graphic chip 200 comprises a graphic engine 201, a command generator 202, a latch 203, a bank-pair detector 204, and a timing generator 205.

When the graphic chip 200 receives a primitive instruction, the graphic engine 201 creates graphic data, for example, including dot-designation and color designation. In response, the command generator 202 generates a command to write into the memory chip 300 data in accordance with the graphic data. The generated command is delivered into the latch 203, the bank-pair detector 204 and the timing generator 205. The latch 203 holds the generated command for the predetermined time interval under the control of the bank-pair detector 204 and the timing generator 205. In response to the generated command as a current command, the bank-pair detector 204 detects whether or not the current command is issued for the same bank pair of the command preceding to the current command. If the bank pair of the current command is consistent with the bank pair of the preceding command, the bank-pair detector 204 generates a consistency signal. On the other hand, the bank pair of the current command is inconsistent with the bank pair of the preceding command, the bank-pair detector 204 generates an inconsistency signal. The timing generator 205 holds the above-mentioned first and second command interval specifications, and selects one of them in correspondence with the consistency signal or the inconsistency signal generated by the bank-pair detector 204. In detail, the timing generator 205 selects the first command interval specification in response to the consistency signal, and determines an issuance timing in correspondence with the current command and the preceding command, namely, the following command and the preceding command. On the other hand, the timing generator 205 selects the second command interval specification in response to the inconsistency signal, and determines an issuance timing in correspondence with the current command and the preceding command, namely, the following command and the preceding command. When determining the issuance timing, the timing generator 204 informs the issuance timing by sending a trigger pulse signal for the latch 203, so that the latch 203 issues the current command for the memory chip 300 at the issuance timing.

The memory chip 300 illustrated in FIG. 2 comprises a DRAM device having X-decoders 301, a timing generator 302, memory cell arrays 303, and Y-decoders 304. Each of the memory cell arrays 303 comprises a plurality of storage cells connected to bitlines and wordlines. The X-decoders 301 are coupled to the wordlines, while the Y-decoders 304 are coupled to the bitlines. The X-decoders 301 decode the current command issued by the latch 203, and then activate the respective wordlines. The Y-decoders 304 also decode the current command and then activate the respective bitlines. The timing generator 302 specifies the bank-pair corresponding to the current command, and then issues a first timing generation signal TG1 or a second timing generation signal TG2 for a corresponding one of two switches which is not shown in FIG. 2 and which is described later with FIG. 4. In this embodiment, the X-decoders 301 are arranged to correspond to memory banks, while the Y-decoders 304 are arranged to correspond to bank pairs so that two memory banks belonging to the same bank pair share one Y-decoder with each other. Thus the number of the Y-decoders 304 is a half of that of the X-decoders 301, in this embodiment.

Figure 3:
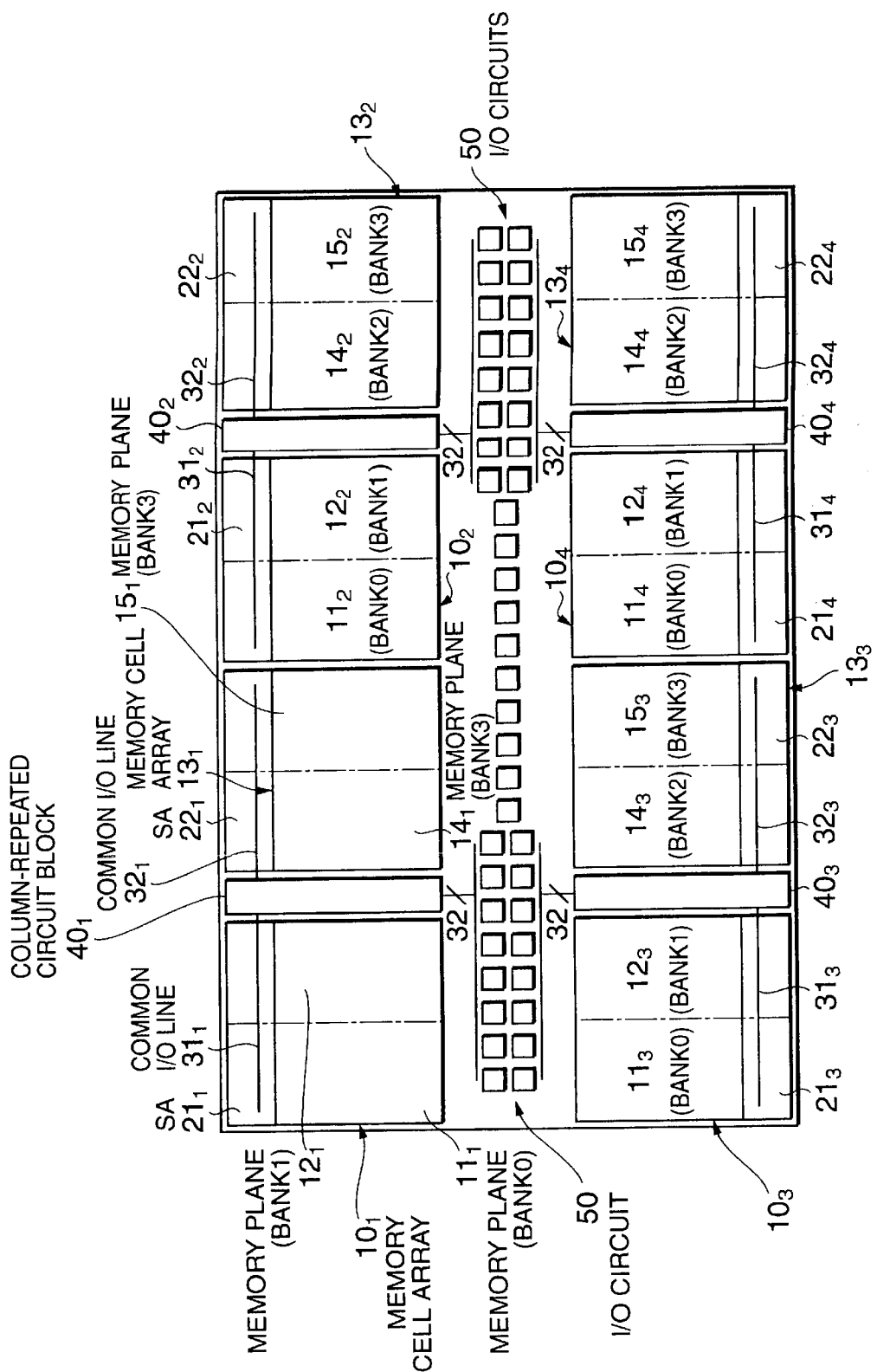
FIG. 3 schematically illustrates a layout in the memory chip constructed in accordance with a preferred embodiment of the present invention.

The DRAM layout of the memory chip 300 is schematically shown in FIG. 3.

The illustrated DRAM device comprises memory cell arrays $10_1$~$10_4$ and $13_1$~$13_4$, sense amplifiers $21_1$~$21_4$ and $22_1$~$22_4$, common I/O lines $31_1$~$31_4$ and $32_1$~$32_4$, column-related circuit blocks $40_1$~$40_4$, and I/O circuits 50. Among them, the memory cell arrays $10_1$ and $13_1$, the sense amplifiers $21_1$ and $22_1$, the common I/O lines $31_1$ and $32_1$, and the column-related circuit block $40_1$ conceptually comprise one memory component whose I/O ability is 32 bits, namely, x32. The remaining memory components are repeatedly patterned in the similar way of the foregoing memory component comprising the memory cell arrays $10_1$ and $13_1$, the sense amplifiers $21_1$ and $22_1$, the common I/O lines $31_1$ and $32_1$, and the column-related circuit block $40_1$. That is, the illustrated DRAM device is of four-fetch type and has a total I/O ability of 128 bits, namely, x128. Hereinafter, for the sake of clarity, an explanation is made about only the memory component comprising the memory cell arrays $10_1$ and $13_1$, the sense amplifiers $21_1$ and $22_1$, the common I/O lines $31_1$ and $32_1$, and the column-related circuit block $40_1$.

In the illustrated DRAM device, the memory cell array 101 comprises a pair of memory planes $11_1$ and $11_2$, while the memory cell array $13_1$ comprises pair of memory planes $14_1$ and $15_1$. The pair of memory planes $11_1$ and $12_1$ correspond to a bank pair A composed of a pair of banks (Bank0, Bank1), while the pair of memory lanes $14_1$ and $15_1$ correspond to another bank pair B composed of a pair of banks (Bank2, Bank3). That is, the memory cell array $10_1$ and the memory cell array $13_1$ are conceptually divided into the pair of memory planes $11_1$ and $11_2$ and the pair of memory planes $11_4$ and $11_5$, respectively. In addition, the sense amplifiers $21_1$ and $22_1$ are provided with the memory cell arrays $10_1$ and $13_1$, and the common I/O lines $31_1$ and $32_1$ are coupled to the sense amplifiers $21_1$ and $22_1$. Thus, in this embodiment of FIG. 3, the pairs of memory planes $11_1$ and $12_1$, and $14_1$ and $15_1$ share the corresponding ones of the common I/O lines $31_1$ and $32_1$.

Figure 4:
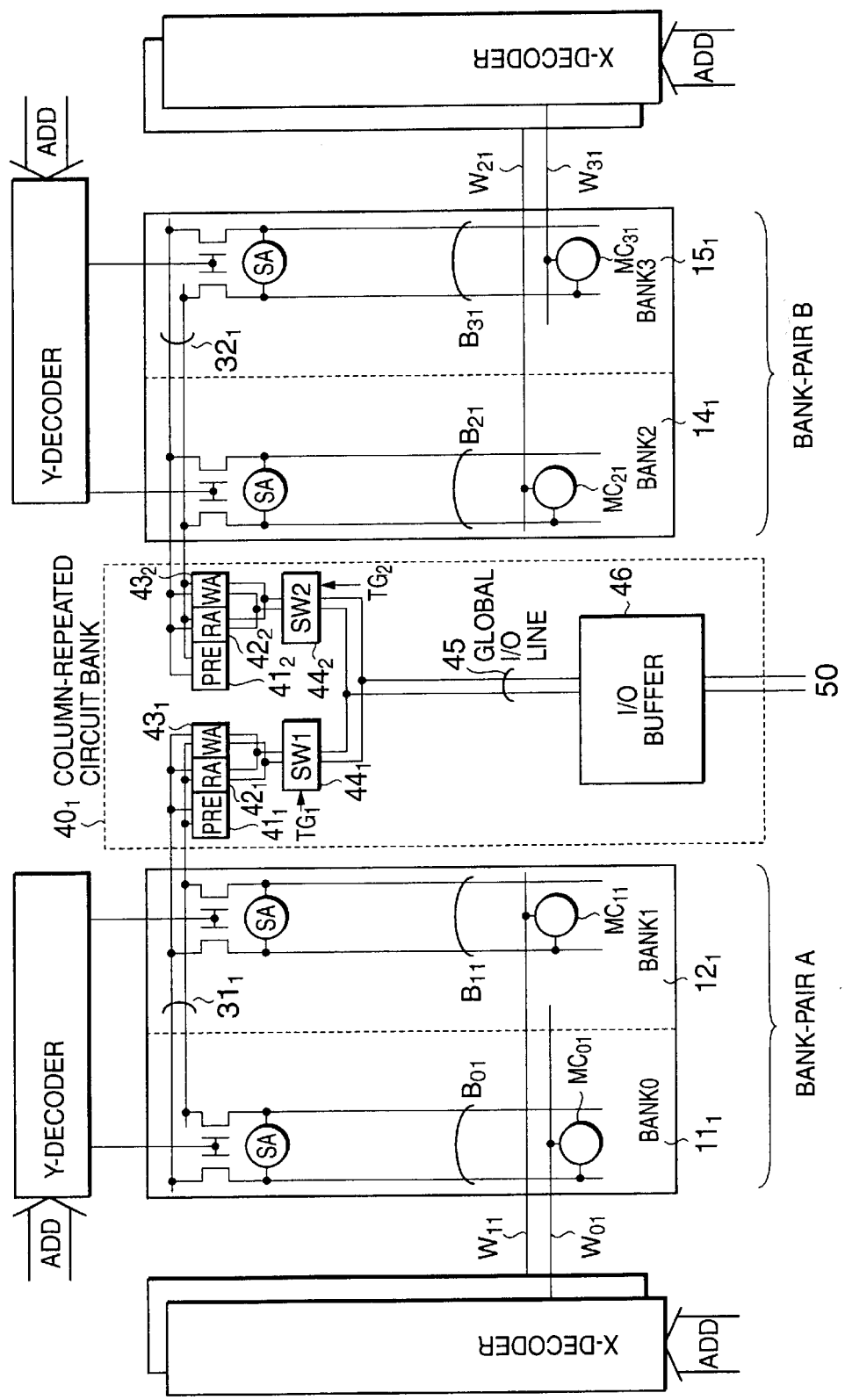
FIG. 4 is an exemplary, enlarged view of the memory planes $11_1$, $12_1$, $14_1$, $15_1$ and the column-related circuit block 401, that are illustrated in FIG. 3.

Referring to FIG. 4, the memory planes $11_1$, $12_1$, $14_1$, $15_1$ and the column-related circuit block $40_1$, that are shown in FIG. 3, are illustrated in detail. FIG. 4, at each memory bank (Bank0, Bank1, Bank2, Bank3), only one memory cell or storage cell ($MC_{01}$, $MC_{11}$, $MC_{21}$, $MC_{31}$) and one wordline ($W_{01}$, $W_{11}$, $W_{21}$, $W_{31}$) and two bitlines ($B_{01}$, $B_{11}$, $B_{21}$, $B_{31}$) connected thereto are depicted, although, in actual, a plurality of memory cells are arranged in matrix fashion and a plurality of wordlines and bitlines are connected to the memory cells. The bitlines $B_{01}$ and $B_{11}$ are further connected to the common I/O lines $31_1$ through the sense amplifiers and transfer gate transistors. Similarly, the bitlines $B_{21}$ and $B_{31}$ are further connected to the common I/O lines $32_1$ through the sense amplifiers and transfer gate transistors.

The common I/O lines $31_1$ are coupled to a precharge circuit $41_1$, a read amplifier $42_1$ and a write amplifier $43_1$ in the column-related circuit block $40_1$. The active/inactive states of precharge circuit $41_1$, read amplifier $42_1$ and write amplifier $43_1$ are controlled with a precharge control signal, read-amp control signal and a write-amp control signal, respectively, that are not shown. These signals are activated, for example, in accordance with read or write command. Similarly, the common I/O lines $32_1$ are coupled to a precharge circuit $41_2$, a read amplifier $42_2$ and a write amplifier $43_2$ in the column-related circuit bloc $40_1$, in the same manner of the precharge circuit $41_1$, the read amplifier $42_1$ and the write amplifier $43_1$. In addition, the read amplifiers $42_1$, $42_2$ and the write amplifier $43_1$, $43_2$ are connected to a global I/O lines 45 via first and second switches (SW1, SW2) $44_1$, $44_2$, respectively. The first switch $44_1$ turns on in response to the first timing generation signal TG1 issued by the timing generator 302, while the second switch $44_2$ turns on in response to the second timing generation signal TG2.

As apparent from the figure, the pair of memory planes $11_1$ and $12_1$ share the set of the precharge circuit $41_1$, the read amplifier $42_1$ and the write amplifier $43_1$. Also, the pair of memory planes $14_1$ and $15_1$ share the set of the precharge circuit $41_2$, the read amplifier $42_2$, and the write amplifier $43_2$. Since the pair of memory planes $11_1$ and $12_1$ correspond to the bank-pair A composed of two banks (Bank0, Bank1), the bank-pair A share the set of precharge circuit $41_1$, the read amplifier $42_1$ and the write amplifier $43_1$. Similarly, the pair of memory planes $14_1$ and $15_1$ correspond to the bank-pair B composed of two banks (Bank2, Bank3), the bank-pair B share the set of precharge circuit $41_1$, the read amplifier $42_1$ and the write amplifier $43_1$. In addition, the bank-pair A and the bank-pair B share the global I/O lines 45 and the I/O buffer 46 with each other. Under the condition of the switches $44_1$, $44_2$, either one of the bank-pair A and the bank-pair B uses the global I/O lines 45 and the I/O buffer 46.

Thus, the DRAM device where the bank pairs are defined is small-sized, by sharing some components.

Operations

Now, operations with this structure will be explained below with reference to FIGS. 5 to 13.

[Write-to-Read Operation]

Figure 7:
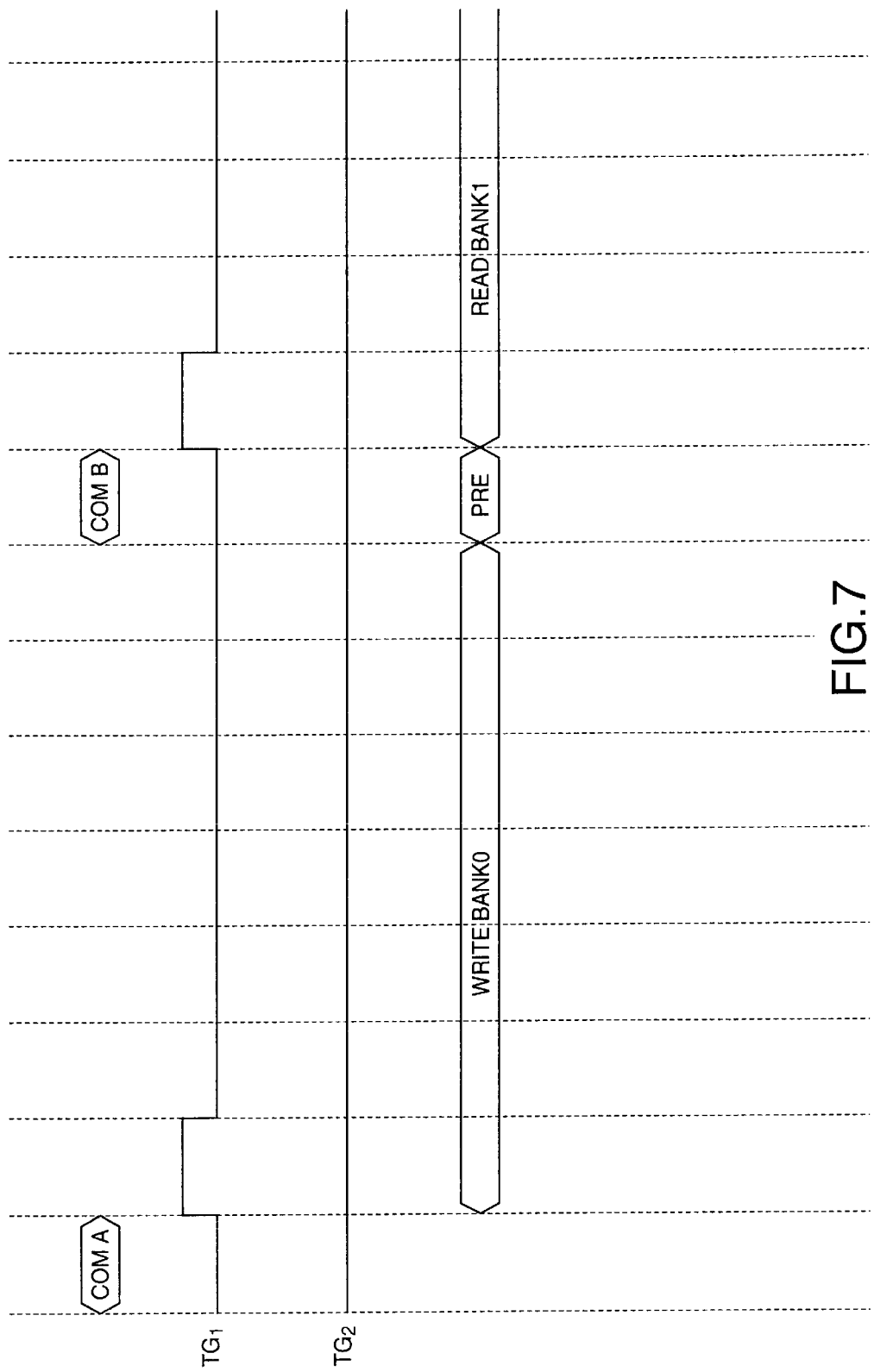
FIG. 7 is a timing diagram for use in describing a generation of $TG_1$ and $TG_2$ in the case of write-to-read accessing the same bank-pair operation.
Figure 8:
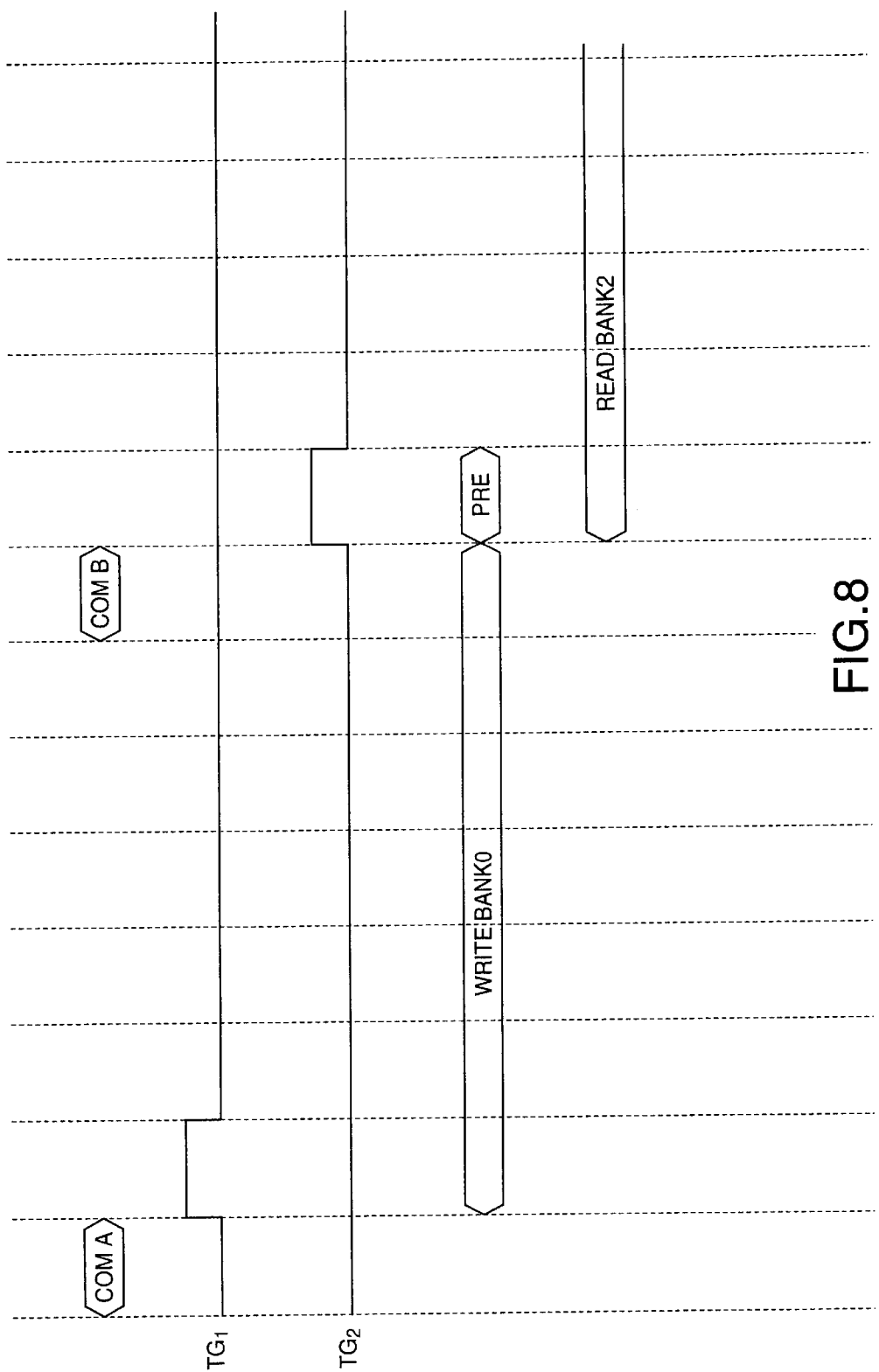
FIG. 8 is a timing diagram for use in describing a generation of $TG_1$ and $TG_2$ in the case of write-to-read accessing the different bank-pair operation.

FIG. 5 shows command sequences of write-to-read operation in the same bank-pair case, and FIG. 6 shows command sequences of write-to-read operation in the different bank-pair case. The command sequences are issued by the graphic chip 200 in compliance with the first and second command interval specifications, as shown in FIGS. 7 and 8, and are delivered into the timing generator 302 of the memory chip 300 (See FIG. 2). In response, the timing generator 302 generates the first and second timing generation signals TG1 and TG2, as shown in FIGS. 7 and 8. In these figures, a symbol "Write Bank0" represents a time period where the decoding and writing are carried out, for example, by the X- and Y-decoders in response to the write command, and similarly, other symbols illustrate decoding, reading writing processes.

In FIG. 7, since the commands A and B are issued for the bank-pair A, only the first timing generation signal TG1 rises responsive to the commands A and B. On the other hand, in FIG. 8, the commands A and B are issued for the bank of the bank-pair A and the bank of the bank-pair B, respectively. Therefore, the first timing generation signal TG1 rises responsive to the command A, while the second timing generation signal TG2 rises responsive to the command B. In comparison FIG. 7 with FIG. 8, the command interval illustrated in FIG. 7 is longer by one clock than the command interval illustrated in FIG. 8.

Figure 9:
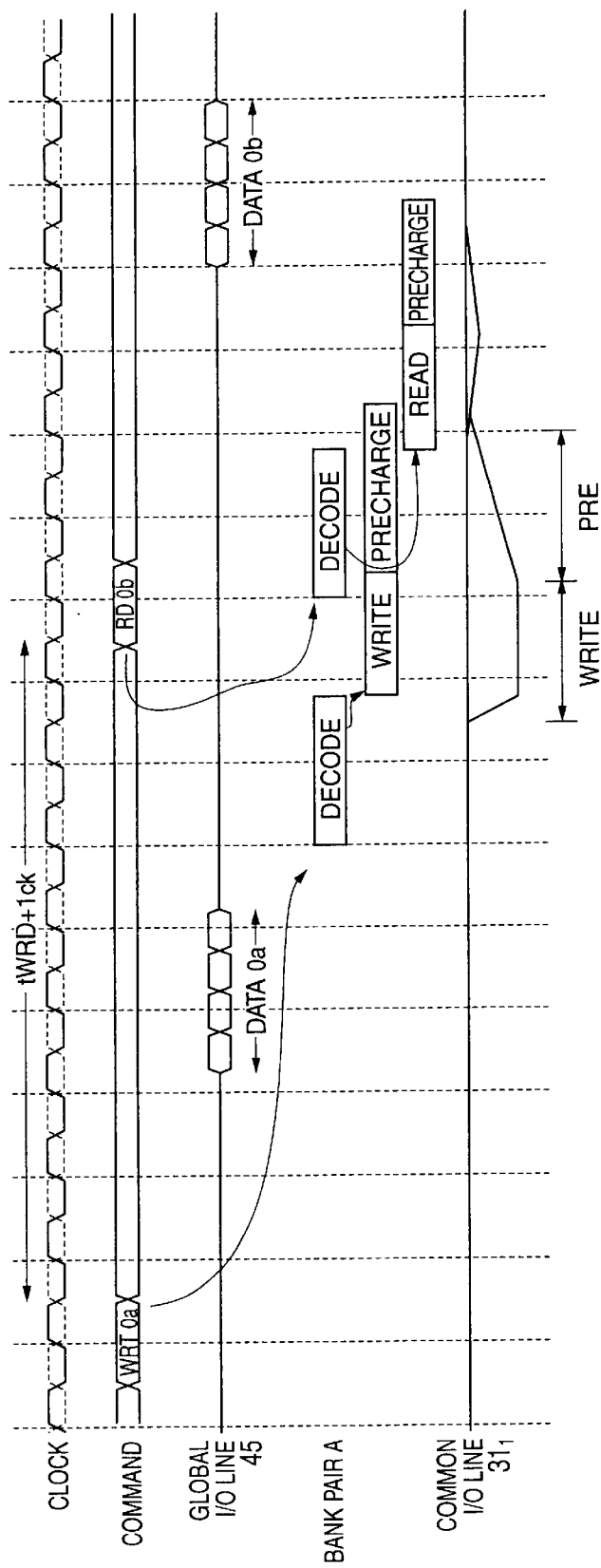
FIG. 9 is a timing diagram of the write-to-read operation in relation to the same bank-pair.
Figure 10:
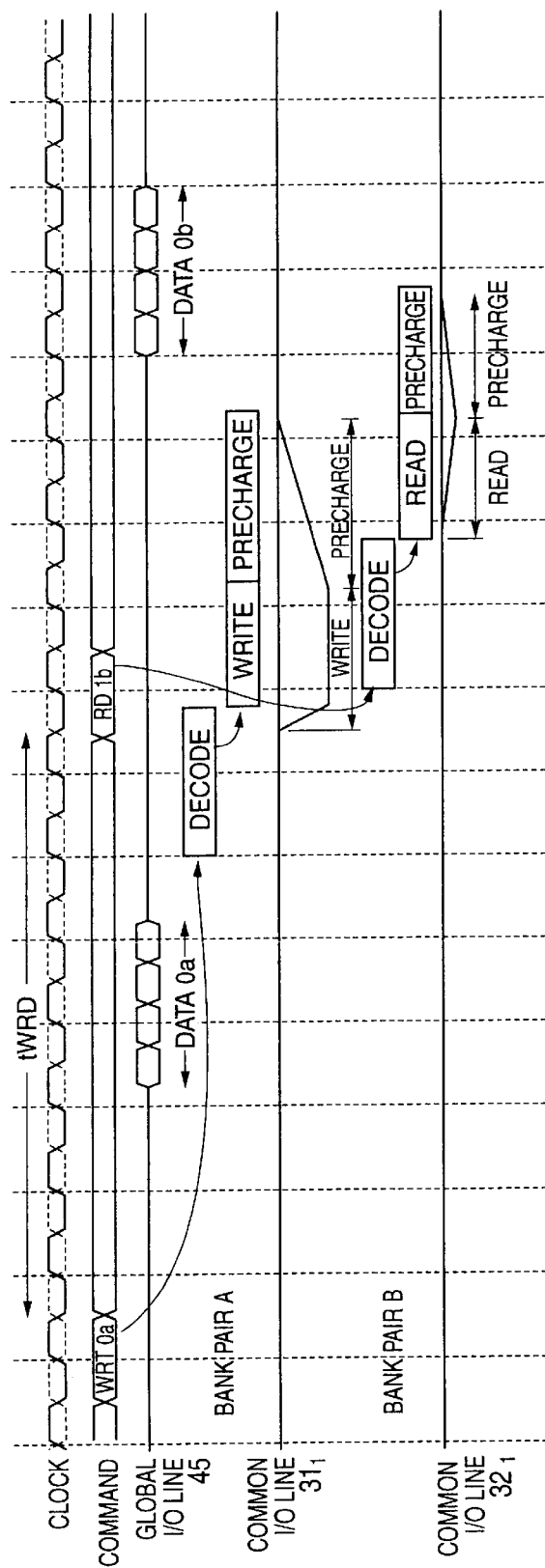
FIG. 10 is a timing diagram of the write-to-read operation in relation to the different bank-pairs.

FIGS. 9 and 10 illustrate the internal operations corresponding to the command sequences shown in FIGS. 5 and 6, respectively. That is, FIG. 9 shows the internal operation in the same bank-pair case, and FIG. 10 shows the internal operation in the different bank-pair case. In FIGS. 9 and 10, data are transferred on the global I/O lines 45 with "x4 burst transfer" manner. The invention is however limited to the x4 burst transfer, and other burst transfer manner, for example, x8, x64 burst transfers may be adopted.

In FIG. 9, the command "WRT0a" is the write command for the memory plane $11_1$, namely, Bank0, and the command "RD0b" is the read command for the memory plane $12_1$, namely, Bank1. The write operation and the read operation following the write operation use the common I/O lines $31_1$. In write operation, the common I/O lines $31_1$ have the large amplitude because the drive ability of the write amplifier $43_1$ is high to store securely a write data into a selected memory cell. In this embodiment, the amplitude according to the write operation is equal to the voltage difference between VDD and GND, for example, 1.8 V. On the contrary, the drive ability of the sense amplifier SA is low, so that the amplitude of the common I/O lines $31_1$ is small, for example, 300 mV, to rapidly read out a read data from a selected memory cell. See row of "Common I/O line $31_1$" in FIG. 9. Therefore, prior to the read operation, the precharging of the common I/O lines $31_1$ are required after the write operation. In this embodiment, the precharge time is one clock. Thus, the graphic chip 200 issues the read command RD0b when the interval "tWRD+1ck" passes since the issuance of the write command WRT0a, in compliance with the first command interval specification (See Table. 1).

In FIG. 10, the command "WRT0a" is the write command for the memory plane $11_1$, namely, Bank0, and the command "RD1b" is the read command for the memory plane $15_1$, namely, Bank3. The write operation uses the common I/O lines $31_1$, while the read operation following the write operation uses the common I/O lines $32_1$. Therefore, the read operation using the common I/O lines $32_1$ is carried out during the precharging of the common I/O lines $31_1$ carried out after the write operation using the common I/O lines $31_1$. Thus, the graphic chip 200 issues the read command RD1b when the interval "tWRD" passes since the issuance of the write command WRT0a, in compliance with the second command interval specification (See Table. 2). Thus the command intervals are substantially shortened in the case where the events compliant with the second command interval specification occur in the DRAM device.

[Read-to-Read Operation]

Figure 11:
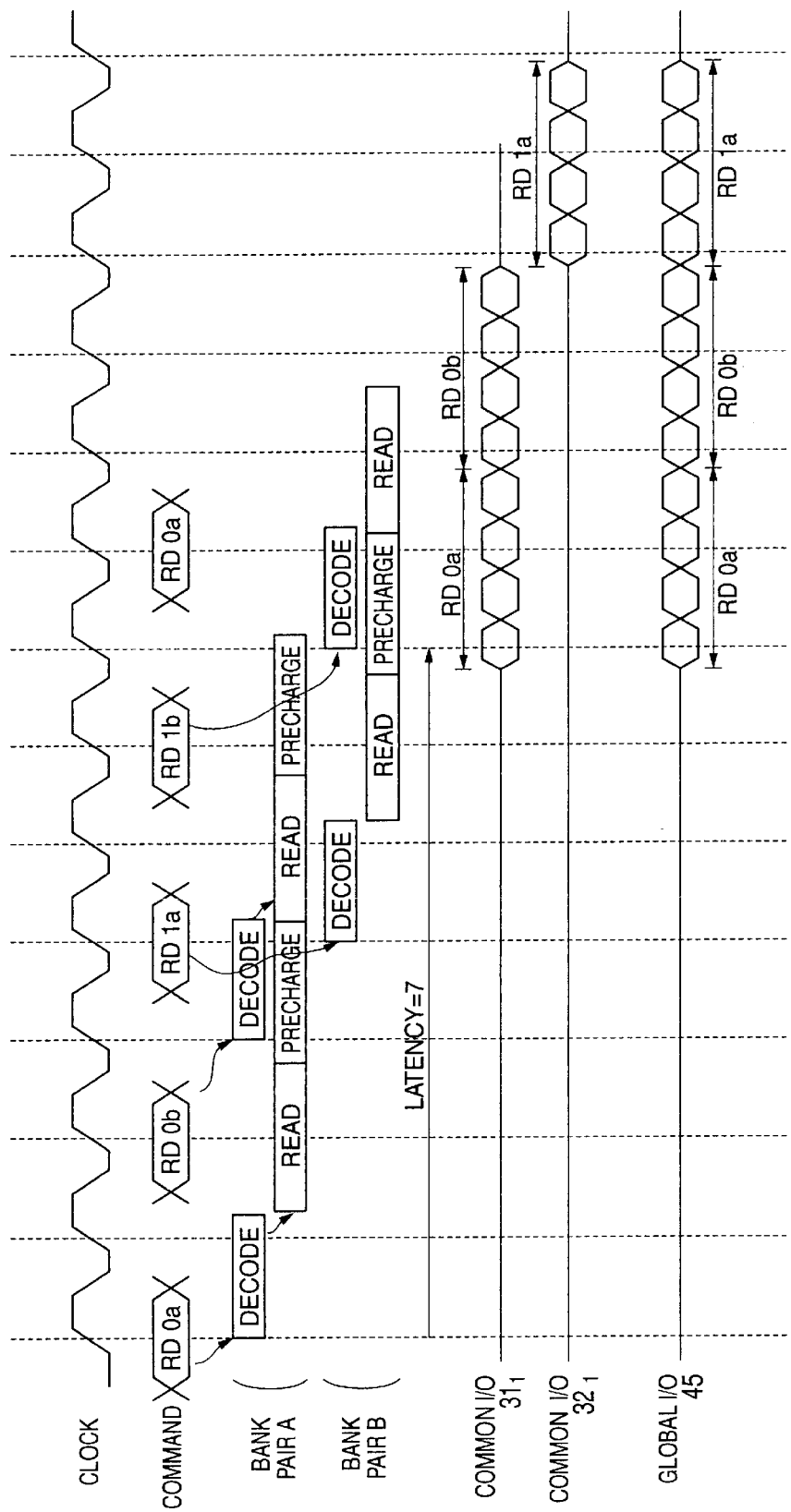
FIG. 11 is a timing diagram of the read-to-read operation.

FIG. 11 shows the internal operations in read-to-read command sequences. In FIG. 11 the commands "RD0a", "RD0b", "RD1a" and "RD1b" are the read commands for the memory planes $11_1$, $12_1$, $14_1$ and $15_1$, respectively. The read operations of the commands "RD0a" and "RD0b" use the common I/O lines $31_1$, while the other read operations of the commands "RD1a" and "RD1b" use the common I/O lines $32_1$. The command interval of the same bank-pair case is equal to the command interval of the different bank-pair case, so that the data collision does not occur in the global I/O lines 45 and, in even if the same bank-pair case, no precharge time can be required. This reason is follows. The preceding read command causes an amplitude corresponding to the data read out on the common I/O lines $31_1$, $32_1$ and, after the preceding read operation, the amplitude remains on the common I/O lines $31_1$, $32_1$. However, the preceding amplitude is small and can be overwritten by a new amplitude of other data read out with the following read command. Therefore, the following read command needs no precharge time, so that the read-to-read command interval is the same in either the same bank-pair case and the different bank-pair case. In addition, "latency" in the illustrated embodiment is seven clocks, which are the same in either the same bank-pair case and the different bank-pair case. See Tables. 1 and 2.

[Write-to-Write Operation]

Figure 12:
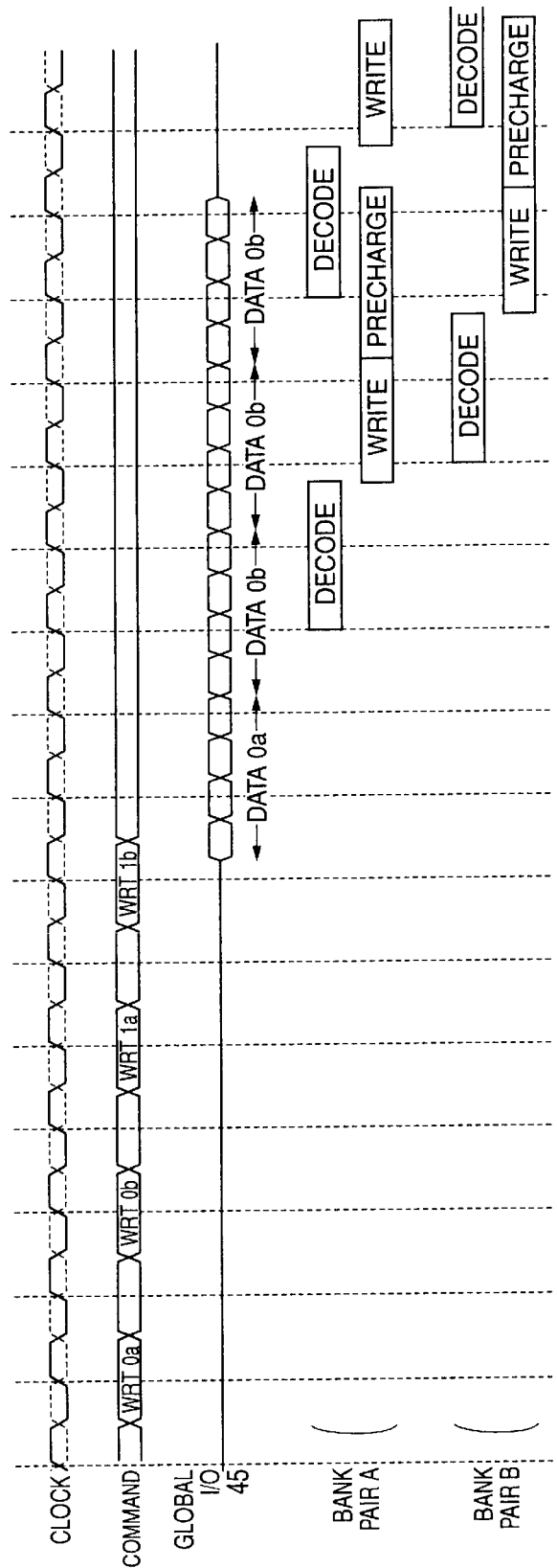
FIG. 12 is a timing diagram of the write-to-write operation.

FIG. 12 shows the internal operations in write-to-write command sequences. In FIG. 12, the commands "WRT0a", "WRT0b", "WRT1a" and "WRT1b" are the write commands for the memory planes $11_1$, $12_1$, $14_1$ and $15_1$, respectively. The write operations of the commands "WRT0a" and "WRT0b" use the common I/O lines $31_1$, while the other write operations of the commands "WRT1a" and "WRT1b" use the common I/O lines $32_1$, which are not shown in FIG. 12. The command interval of the same bank-pair case is equal to the command interval of the different bank-pair case, and the command intervals in the write-to-write operation are determined under the consideration of the data transfer on the global I/O lines 45 and no consideration of precharge time after the preceding command. This is because, although the large amplitude corresponding to the preceding write command remains on the common I/O lines 311, 321, the write amplifiers $43_1$, $43_2$ produces a new large amplitude in response to the following command and can overcome the preceding large amplitude with the new large amplitude. See Tables. 1 and 2.

[Read-to-Write Operation]

Figure 13:
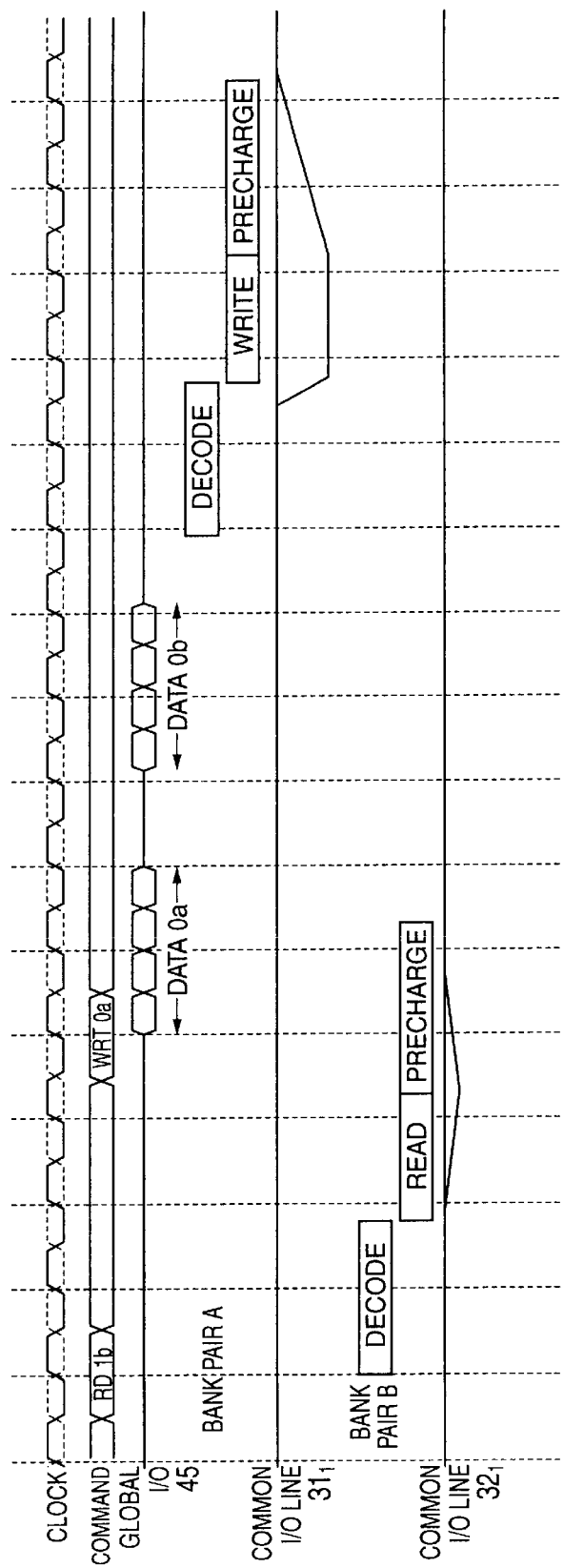
FIG. 13 is a timing diagram of the read-to-write operation in relation to the different bank-pairs.

FIG. 13 shows the internal operations in read-to-write command sequences for the different bank-pair case. In FIG. 13, the command "RD1b" is the read command for the memory plane $15_1$, namely, Bank3, and the command "WRT0a" is the write command for the memory plane $11_1$, namely, Bank0. The read operation following the write operation uses the common I/O lines $32_1$, while the write operation uses the common I/O lines $31_1$.

In Tables. 1 and 2, the command interval of the same bank-pair case is different from the command interval of the different bank-pair case. In this concrete embodiment, because the drive ability of the write amplifier is high and the write amplifier overcomes the small amplitude of the common I/O lines, the precharge of the common I/O lines after the read command can be omitted. Thus, the command interval of the same bank-pair case may be equal to the command interval of the different bank-pair case.

[Others]

Figure 14:
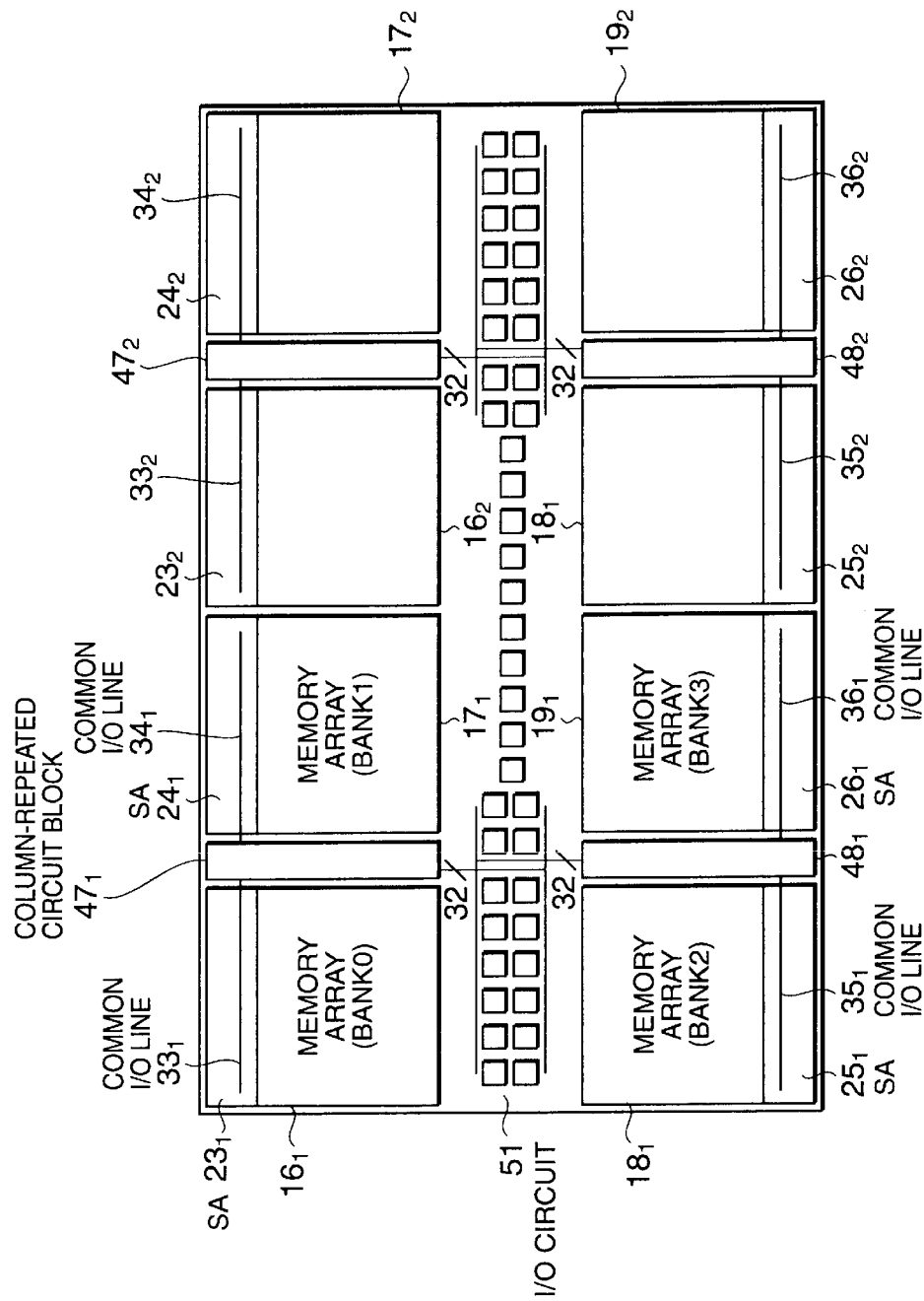
FIG. 14 schematically illustrates a layout in a memory chip constructed in accordance with another preferred embodiment of the present invention.

FIG. 14 shows another DRAM device constructed according to another concrete embodiment of the bank pair case.

The illustrated DRAM device comprises memory cell arrays $16_1$, $16_2$, $17_1$, $17_2$, $18_1$, $18_2$, $19_1$, $19_2$, sense amplifiers $23_1$, $23_2$, $24_1$, $24_2$, $25_1$, $25_2$, $26_1$, $26_2$, common I/O lines $33_1$, $33_2$, $34_1$, $34_2$, $35_1$, $35_2$, $36_1$, $36_2$, column-related circuit blocks $47_1$, $47_2$, $48_1$, $48_2$, and I/O circuits 51. Among them, the memory cell arrays $16_1$, $17_1$, $18_1$, $19_1$, the sense amplifiers $23_1$, $24_1$, $25_1$, $26_1$, the common I/O lines $33_1$, $34_1$, $35_1$, $36_1$, and the column-related circuit block $47_1$, $48_1$ conceptually comprise one memory component whose I/O ability is 32+32 bits, namely, x64. The remaining memory components are configured in the similar way of the foregoing memory component. That is, the illustrated DRAM device has a total I/O ability of 128 bits, namely, x128. Hereinafter, for the sake of clarity, an explanation is made about only the memory component comprising the memory cell arrays $16_1$, $17_1$, $18_1$, $19_1$, the sense amplifiers $23_1$, $24_1$, $25_1$, $26_1$, the common I/O lines $33_1$, $34_1$, $35_1$, $36_1$, and the column-related circuit block $47_1$, $48_1$.

In the illustrated DRAM device, the memory cell arrays $16_1$, $17_1$, $18_1$, $19_1$ correspond to banks (Bank0, Bank1, Bank2, Bank3), respectively. The memory cell arrays $16_1$ and $17_1$ comprise one bank pair of Bank0 and Bank1, while the memory cell arrays $18_1$ and $19_1$ comprises another bank pair of Bank2 and Bank3. The sense amplifiers $23_1$, $24_1$, $25_1$ and $26_1$ are provided with the memory cell arrays $16_1$, $17_1$, $18_1$, $19_1$, and furthermore, the common I/O lines $33_1$, $34_1$, $35_1$ and $36_1$ are coupled to the sense amplifiers $23_1$, $24_1$, $25_1$ and $26_1$, respectively. The column-related circuit block $44_1$ is coupled to a pair of common I/O lines $33_1$ and $34_1$, while the column-related circuit block $47_1$ is coupled to the common I/O lines $35_1$ and $36_1$.

In the column-related circuit block $47_1$, a precharge circuit, a read amplifier and a write amplifier, which are not shown, are arranged and coupled to the pair of common I/O lines $33_1$ and $34_1$, so as to be shared by the pair of memory cell arrays $16_1$ and $17_1$ as the bank pair. Similarly, In the column-related circuit block $48_1$, a precharge circuit, a read amplifier and a write amplifier, which are also not shown, are arranged and coupled to the pair of common I/O lines $35_1$ and $36_1$, so as to be shared by the pair of memory cell arrays $18_1$ and $19_1$ as the bank pair. Thus the DRAM device according to the present embodiment is also small-sized.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed is:

1. A method of designing and using semiconductor memory device that comprises a plurality of banks, comprising:

defining first and second command interval specification which are different from each other, the first command interval specifications being defined as a relationship between a preceding command and a following command that are issue for the same bank, the second command interval specifications being defined as the relationship between a preceding command and a following command that are issued for different banks, respectively;

operating the semiconductor memory device on the basis of the first and second command interval specifications;

configuring common I/O lines in accordance with pairs of said banks; and coupling with each of the common I/O lines a set of a read amplifier, a write amplifier and a precharge circuit so that the pair of banks share the respective set of read amplifier, write amplifier and precharge circuit.

2. The method as claimed in claim 1, wherein the first and second command interval specifications are defined so that a time interval defined in the second command interval specification can be shorter than another time interval defined in the first command interval specification, for a predetermined combination of a preceding command and a following command, the preceding command being accompanied with a precharge.

3. The method as claimed in claim 2, wherein the predetermined combination is of write command as the preceding command and read command as the following command.

4. The method as claimed in claim 2, wherein the predetermined combination is of read command as the preceding command and write command as the following command.

5. A method of designing and using a semiconductor device comprising:

arranging a plurality of memory cell arrays;

conceptually dividing each of the memory cell arrays into a pair of memory planes that corresponds to one of the bank pairs;

configuring common I/O lines in correspondence with the memory cell arrays, respectively, so that the pair of memory planes share the respective common I/O line;

coupling with each of the common I/O lines a set of a read amplifier, a write amplifier and a precharge circuit, so that the pair of memory planes share the respective set of read amplifier, write amplifier and precharge circuit;

defining first and second command interval specifications which are different from each other, the first command interval specifications being defined as a relationship between a preceding command and a following command that are issued for the same bank, the second command interval specifications being defined as the relationship between a preceding command and a following command that are issued for different banks, respectively; and operating the semiconductor memory device on the basis of the first and second command interval specifications.

6. A method of designing and using a semiconductor device comprising:

arranging a plurality of memory cell arrays that correspond to one of the banks;

configuring common I/O lines in correspondence with the memory cell arrays, respectively;

coupling a set of read amplifier, write amplifier and precharge circuit with a pair of the common I/O lines which correspond to a pair of memory cell arrays corresponding to one of the bank pairs, so that the pair of memory cell arrays share the respective set of read amplifier, write amplifier and precharge circuit;

defining first and second command interval specifications which are different from each other, the first command interval specifications being defined as a relationship between a preceding command and a following command that are issued for the same bank, the second command interval specifications being defined as the relation hip between a preceding command and a following command that are issued for different banks, respectively; and operating the semiconductor memory device on the basis of the first and second command interval specifications.

7. A semiconductor memory device comprising a plurality of banks, and a plurality of sets of column-related circuits, wherein: pair of the banks are defined as bank pairs; and one of the bank pairs share the respective sets of column-related circuits wherein each of the sets of column-related circuits comprises a read amplifier, a write amplifier and a precharge circuit.

8. A semiconductor memory device as claimed in claim 7, wherein first and second command interval specifications are defined which are different from each other, the first command interval specifications being defined as a relationship between a preceding command and a following command that are issued for the same bank pair, the second command interval specifications being defined as the relationship between a preceding command and a following command that are issued for different bank pairs, respectively, so that each of the banks operates on the basis of the first and second command interval specifications.

9. A semiconductor memory device as claimed in claim 8, comprising a plurality of memory cell arrays and a plurality of common I/O lines, wherein:

each of the memory cell arrays comprises a pair of memory planes where each of the banks is implemented, so that the bank pair corresponds to one of the memory cell arrays;

the common I/O lines correspond to the memory cell arrays, respectively; and each of the sets of column-related circuits are coupled to corresponding one of the common I/O lines, so as to be shared by the respective bank pair.

10. A semiconductor memory device as claimed in claim 8, comprising a plurality of memory cell arrays and a plurality of common I/O lines, wherein:

each of the banks is implemented on one of the memory cell arrays;

the common I/O lines correspond to the memory cell arrays, respectively; and each of the sets of column-related circuits are coupled a pair of to the common I/O lines corresponding to one of the bank pairs, so as to be shared by the corresponding bank pair.

11. A semiconductor memory device comprising:

a plurality of memory cell arrays of storage cells organize into rows and columns, each of the memory cell arrays comprising a pair of memory planes which corresponds to a bank pair comprising a pair of banks;

a plurality of sense amplifiers arranged in correspondence with the memory cell arrays;

a plurality of common I/O lines coupled to the sense amplifiers, so that the pair of memory planes of each of the memory cell arrays shares the corresponding one of the common I/O lines;

a plurality of read amplifiers coupled to the common I/O lines, respectively;

a plurality of write amplifiers coupled to the common I/O lines, respectively; and a plurality of precharge circuits coupled to the common I/O lines, respectively.

12. A semiconductor memory device as claimed in claim 11, wherein one bank belonging to a specific one of bank pairs operates on a first command interval specification if a preceding command of a command issued for the one bank is issued for the other bank belonging to the specific bank pair, while operating on a second command interval specification if a preceding command of a command issued for the one bank is issued for other banks not belonging to the specific bank pair, the first and second command interval specifications being different from each other.

13. A semiconductor memory device as claimed in claim 12, wherein the second command interval specification includes a first time interval which is from a write command to a read command, while the first command interval specification includes a second time interval which is from a write command to a read command and which is longer than the first time interval.

14. A semiconductor memory device as claimed in claim 13, wherein the second command interval specification further includes a third time interval which is from a read command to a write command, while the first command interval specification further includes a fourth time interval which is from a read command to a write command and which is longer than the third time interval.

15. A semiconductor memory device comprising:

a plurality of memory cell arrays of storage cells organized into rows and columns, pairs of the memory cell arrays corresponding to bank pairs, respectively, each of the bank pairs comprising a pair of banks;

a plurality of sense amplifiers arranged in correspondence with the memory cell arrays;

a plurality of common I/O lines coupled to the sense amplifiers;

a plurality of read amplifiers each coupled to a pair of the common I/O lines, respectively;

a plurality of write amplifiers each coupled to a pair of the common I/O lines, respectively; and a plurality of precharge circuits each coupled to a pair of e common I/O lines, respectively, so that the pair of memory cell arrays corresponding to the bank pair shares a corresponding one set of the read amplifier, the write amplifier, and the precharge circuit.

16. A semiconductor memory device as claimed in claim 15, wherein one bank belonging to a specific one of bank pairs operates on a first command interval specification if a preceding command of a command issued for the one bank is issued for the other bank belonging to the specific bank pair, while operating on a second command interval specification if a preceding command of a command issued for the one band is issued for other banks not belonging to the specific bank pair, the first and second command interval specifications being different from each other.

17. A semiconductor memory device as claimed in claim 16, wherein the second command interval specification includes a first time interval which is from a write command to a read command, while the first command interval specification includes a second time interval which is from a write command to a read command and which is longer than the first time interval.

18. A semiconductor memory device as claimed in claim 17, wherein the second command interval specification further includes a third time interval which is from a read command to a write command, while the first command interval specification further includes a fourth time interval which is from a read command to a write command and which is longer than the third time interval.

19. A method of issuing commands from a memory controller to a semiconductor memory device and designing and using the semiconductor memory device that comprises a plurality of banks, comprising:

defining first and second command interval specification which are different from each other, the first command interval specifications being defined as a relationship between a preceding command and a following command that are issued for the same bank, the second command interval specifications being defined as the relationship between a preceding command and a following command that are issued for different banks, respectively;

sending commands from the memory controller to the semiconductor memory device in compliance with the first and second command interval specifications;

configuring common I/O lines in accordance with pairs of said banks; and coupling with each of the common I/O lines a set of a read amplifier, a write amplifier and a precharge circuit so that the pair of banks share the respective set of read amplifier, write amplifier and precharge circuit.

20. A command issuance method as claimed in claim 19, wherein the first and second command interval specifications are defined so that a time interval defined in the second command interval specification can be shorter than another time interval defined in the first command interval specification, for a predetermined combination of a preceding command and a following command, the preceding command being accompanied with a precharge.

21. A command issuance method as claimed in claim 20, wherein the predetermined combination is of write command as the preceding command and read command as the following command.

22. A command issuance method as claimed in claim 20, wherein the predetermined combination is of read command as the preceding command and write command as the following command.

23. A semiconductor memory device comprising:

a first group of a plurality of memory cells;

a second group of a plurality of memory cells;

an input/output buffer;

a first switch coupled between said buffer and said first group and receiving a first control signal; and a second switch coupled between said buffer and said second group and receiving a second control signal;

said first switch being controlled with a first interval between the first control signals activated sequentially when said first group is accessed sequentially;

said first and second switches being controlled with a second interval different from said first interval between the first and second control signals activated sequentially when said first and second groups are accessed sequentially; and wherein said first group of memory cells includes at least first and second memory banks which are coupled to said first switch via a first common bus line, and said second group of memory cells includes at least third and fourth second memory banks which are coupled to said second switch via a second common bus line.

24. The device as claimed in claim 23, wherein said first interval is longer by a period than said second interval.

25. The device as claimed in claim 24, wherein said period is based on a precharge.

26. The device as claimed in claim 25, wherein when said first group of memory cells is accessed sequentially, said first bank is firstly accessed, said second bank is secondly accessed, said precharge is performed to precharge said first common bus line after said first bank is accessed before said second bank is accessed.

27. The device as claimed in claim 26, wherein said first and second groups of memory cells are accessed sequentially, one of said first and second banks are accessed, then said precharge is performed to precharge said first common bus line, and said third bank is accessed while said first common bus line is precharged.

28. The device as claimed in claim 23, wherein the sequence access includes a write operation and a read operation following said write operation.

29. The device as claimed in claim 28, wherein when said first group is accessed sequentially, said read operation is performed to said first bank and said precharge is performed to precharge said first common bus line, and then said write operation is performed to said second bank.

* * * * *

UNITED STATES PATENT AND TRADEMARK OFFICE
CERTIFICATE OF CORRECTION

PATENT NO.     : 6,678,204 B2
DATED          : January 13, 2004
INVENTOR(S)    : Osamu Nagashima et al.

It is certified that error appears in the above-identified patent and that said Letters Patent is hereby corrected as shown below:

<u>Title page,</u>
Item [*] Notice, the term of the patent adjustment is to be -- (4) days --, instead "(33)" days".

Signed and Sealed this

Twenty-fourth Day of August, 2004

JON W. DUDAS
*Director of the United States Patent and Trademark Office*